(12) United States Patent
Volk et al.

(10) Patent No.: US 6,542,013 B1
(45) Date of Patent: Apr. 1, 2003

(54) FRACTIONAL DIVISORS FOR MULTIPLE-PHASE PLL SYSTEMS

(75) Inventors: Andrew M. Volk, Granite Bay, CA (US); Ronald W. Swartz, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/037,915

(22) Filed: Jan. 2, 2002

(51) Int. Cl.[7] .............................................. H03K 21/00
(52) U.S. Cl. ....................................... 327/115; 327/117
(58) Field of Search .......................... 327/105, 113–115, 327/117, 119, 146, 147, 150, 151, 155, 156, 159, 160, 163; 377/48

(56) References Cited

U.S. PATENT DOCUMENTS

| | | | | |
|---|---|---|---|---|
| 5,889,436 A | * | 3/1999 | Yeung et al. | 331/14 |
| 5,900,784 A | * | 5/1999 | O'Sullivan | 327/156 |
| 6,043,717 A | * | 3/2000 | Kurd | 327/157 |
| 6,157,694 A | * | 12/2000 | Larsson | 327/115 |
| 6,295,327 B1 | * | 9/2001 | Takla | 327/147 |
| 6,369,624 B1 | * | 4/2002 | Wang et al. | 327/147 |
| 6,441,655 B1 | * | 8/2002 | Fallahi et al. | 327/115 |

* cited by examiner

*Primary Examiner*—My-Trang Nu Ton
(74) *Attorney, Agent, or Firm*—Blakely, Sokoloff, Taylor & Zafman LLP (57) ABSTRACT

A frequency multiplier is described for synthesizing frequencies. The frequency multiplier includes a phase locked loop (PLL) circuit having an oscillator to generate a number of phase signals and a phase-shifting circuit coupled to the PLL circuit to select one of the phase signals generated by the oscillator according to a defined phase sequence to be passed to a feedback loop. Also included in the frequency multiplier is a divide-by-M circuit inserted in the feedback loop which divides a frequency of the signal selected by the phase-shifting circuit to generate a feedback signal for the PLL circuit. In one embodiment, the feedback signal generated by the divide-by-M circuit serves as a control signal to enable the phase-shifting circuit.

29 Claims, 5 Drawing Sheets

FRACTIONAL DIVISORS FOR MULTIPLE-PHASE PLL SYSTEMS

BACKGROUND

1. Field of the Invention

The present invention generally relates to frequency multipliers, and in particular, to a fractional frequency multiplier.

2. Description of the Related Art

The number of different clock frequencies that are required in an electronic component continues to increase. If the required clock frequencies are integer multiples of a reference frequency, a conventional phase-locked loop (PLL) circuit may be used to synthesize the required frequencies using a reference input signal produced by a single clock source. However, circumstances exist in which the desired clock frequencies are not precisely equal to integer multiples of a reference frequency.

In certain instances, it is difficult to synthesize required frequencies for components using commonly available base frequencies, such as, for example, 33 or 133 MHz. For example, high-speed serial links on a computer platform may be configured to operate in 1.5 to 2.5 GHz range. Synthesizing such frequencies (1.5 or 2.5 GHz) from a 33 or 133 MHz clock source may not be easily implemented. Specifically, synthesizing 2.5 GHz from a 133 MHz source involves multiplying the reference frequency by a non-integer value. And synthesizing 2.5 GHz from a 33 MHz source involves using a large feedback divisor (i.e. divide-by 75) which leads to issues with instability. In such a case, because the period of the feedback clock is larger, there is more time for the frequency of the voltage controlled oscillator (VCO) to drift before obtaining a correction from the phase detector, charge pump and filter, causing undesirable jitter. Because 1.5 or 2.5 GHz cannot be easily synthesized using 33 or 133 MHz frequencies, synthesizing such frequencies may require the platform to add another clock generator at some cost or use two cascaded PLL circuits to multiply a reference frequency by a non-integer value.

One conventional technique for multiplying a reference frequency by a non-integer value involves varying the feedback divisor integer value during a predefined divide sequence in order to simulate fractional division. For example, to generate a 2.5 GHz output signal from a 133 MHz reference signal, the input reference signal needs to be multiplied by a factor of 18.75. Using the conventional technique, such fractional multiplication may be accomplished by implementing 19-19-19-18 divide sequence in the feedback loop. In this case, fractional division of 18.75 is simulated by using a divisor value of 19 during the first three divide cycles and 18 for the fourth divide cycle. Although the PLL loop filter tries to average the phase error produced during 19-19-19-18 divide sequence, some of the phase error resulting from switching between different divisor integer values gets passed through the filter and causes the VCO to generate undesirable phase jitter. However, it has been found that keeping phase jitter low is critical to the performance, especially in high frequency applications.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

In the following description, specific details are set forth in order to provide a thorough understanding of the present invention. However, it will be apparent to one skilled in the art that the present invention may be practiced without these specific details. In other instances, well-known circuits, structures and techniques have not been shown in detail in order to avoid obscuring the present invention.

A frequency multiplier is described. The frequency multiplier includes a phase locked loop (PLL) circuit having an oscillator to generate a number of equally spaced phase signals and a phase-shifting circuit coupled to the PLL circuit to select, according to a defined phase sequence, one of the phase signals generated by the oscillator to be passed to a feedback loop. A divide-by-M circuit inserted in the feedback loop which divides the frequency of the signal selected by the phase-shifting circuit to produce a feedback signal for the PLL circuit. In one embodiment, the feedback signal generated by the divide-by-M circuit serves as a control signal to enable the phase-shifting circuit.

According to one embodiment, the feedback signal applied to the feedback terminal of the PLL circuit has uniform frequency. By maintaining the frequency of the feedback signal at a constant rate, phase jitter is significantly reduced or substantially eliminated. This is in contrast to a conventional fractional frequency multiplier in which the frequency of feedback signal changes, resulting in phase error, and ultimately producing jitter.

Figure 1:
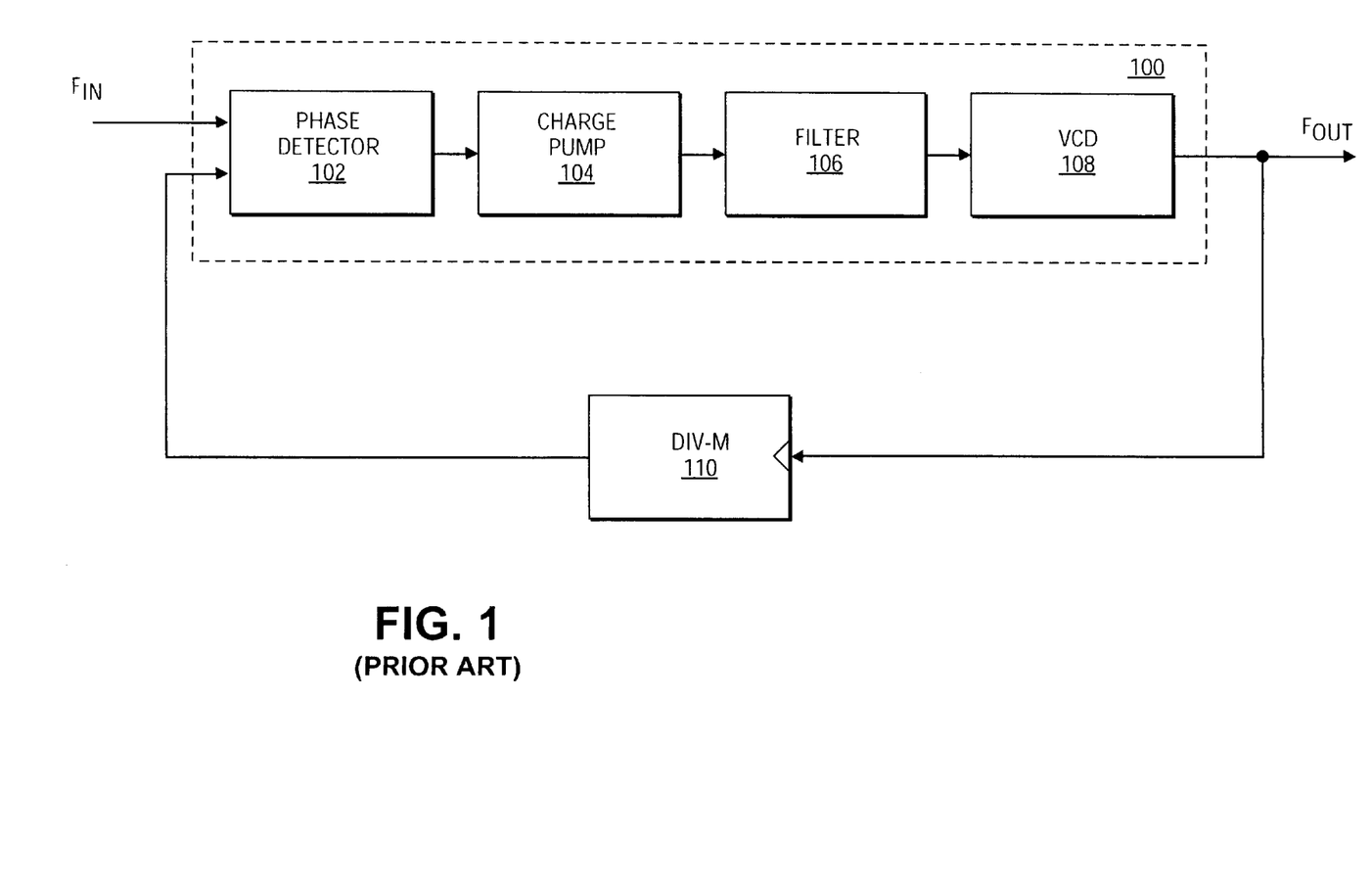
FIG. 1 shows a block diagram of a conventional frequency multiplier.

A conventional frequency multiplier which synthesizes frequencies by means of a phase locked loop (PLL) circuit is shown in FIG. 1. Typically, the PLL circuit 100 includes a phase detector 102, a charge pump 104, a filter 106 and a voltage controlled oscillator (VCO) 108. The VCO 108 produces output signals of the PLL and provides a feedback signal to be applied to the phase detector 102. The phase detector 102 receives an input reference signal (Fin) and the feedback signal and provides an output signal to the VCO 108 via the charge pump 104 and the filter 106. The VCO 108 is operated such that the phase and frequency of the feedback signal applied to the phase detector 102 will be equal with the phase and frequency of the input reference signal (Fin). And by inserting a divide-by-M circuit 110 that divides the VCO output frequency by an integer value M into the feedback loop, the PLL circuit 100 serves as a frequency multiplier that multiplies the frequency of the input reference signal by M.

Figure 2:
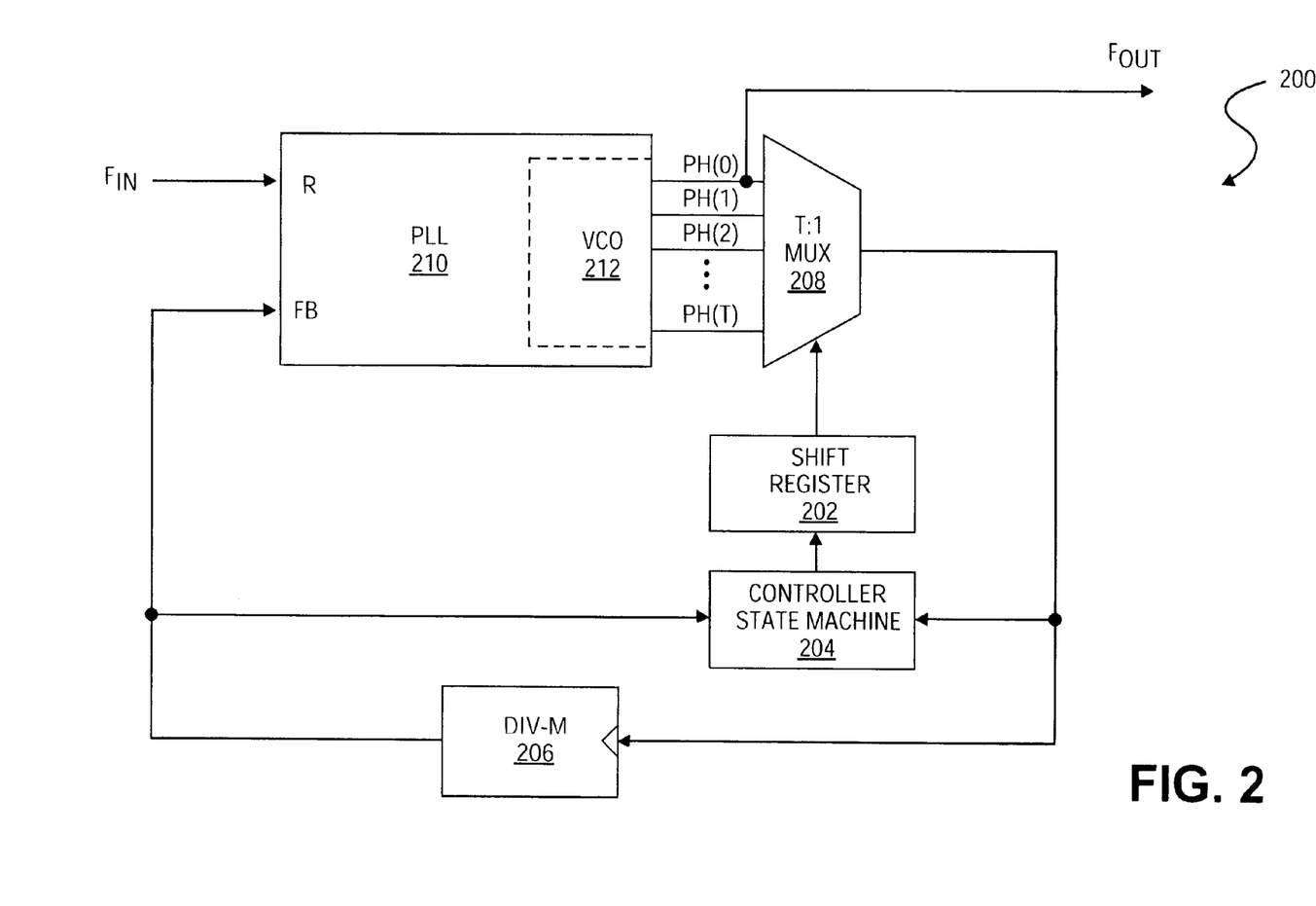
FIG. 2 shows a block diagram of a fractional frequency multiplier according to one embodiment.
Figure 3A:
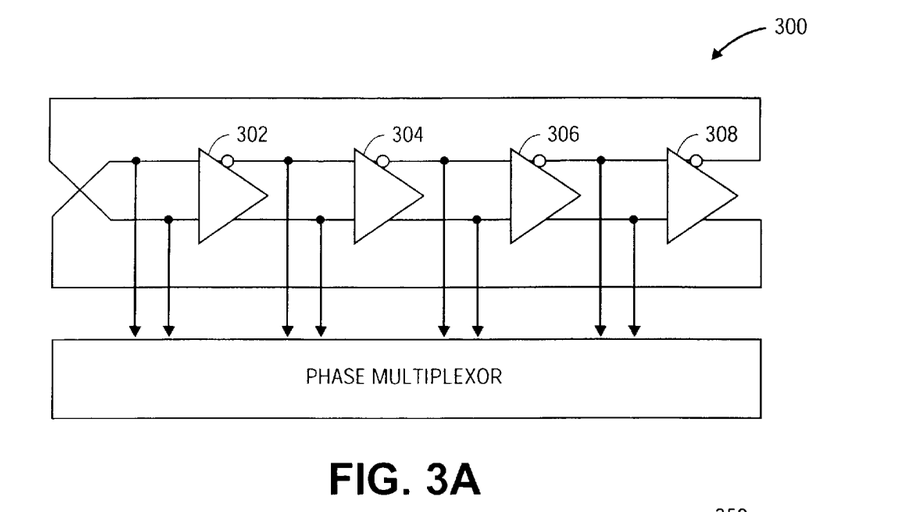
FIG. 3A shows a ring oscillator connected to a phase multiplexer.

FIG. 2 depicts a frequency multiplier 200 according to one embodiment of the invention, which provides fractional division by phase shifting. The multiplier 200 includes a phase locked loop (PLL) circuit 210 having a voltage controlled oscillator (VCO) 212. The VCO 212 may be embodied in the form of a ring oscillator having a number of stages to provide multiple phases, as shown in FIG. 3A. In the embodiment shown in FIG. 3A, the ring oscillator 300 includes a series of buffers 302–308 which are formed into a ring configuration. One or more phases may be obtained from the ring oscillator 300 by using the outputs of different stages. As shown, the output taps of the different stages of the ring oscillator are coupled to a phase multiplexer to obtain four uniform phases from the ring oscillator. However, any other suitable number of phases may be obtained from the VCO to meet the design criteria of a particular implementation. For example, if a ring oscillator that has four stages is employed, then any number of phases (i.e., from one to eight phases) may be utilized.

Figure 3B:
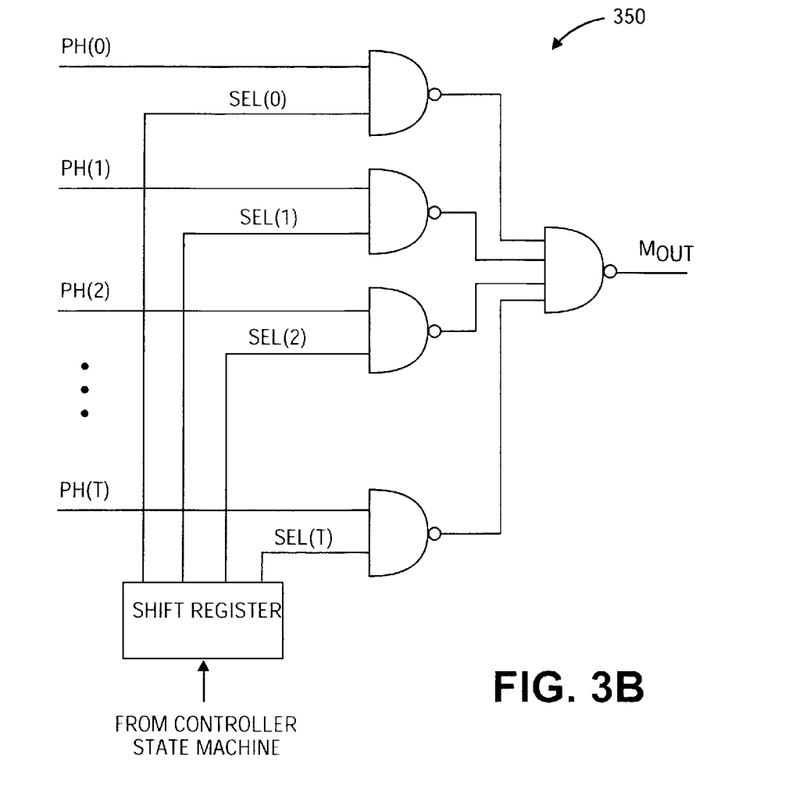
FIG. 3B shows a phase multiplexer according to one embodiment.

Referring back to FIG. 2, the output taps of the VCO 212 are coupled to a phase multiplexer 208. In this embodiment, the phase multiplexer 208 is controlled by a shift register 202 which includes a number of select signal output lines as shown in FIG. 3B. In one embodiment, only one of the select signal output lines of the shift register 202 is set high at a time. The shift register is recirculating in that there is always one output active. And as soon as the active output has been shifted through all of the states of the shift register, the active state recirculates back to the first state. In this regard, the shift register 202 produces outputs in the same fashion as the counter and decoder disclosed below.

The shift register 202 is coupled to a controller state machine 204 configured to control the operation of the shift register to drive the appropriate select input for the multiplexer. More specifically, the controller state machine 204 is configured to control the number of times the output phases (PH(0)-PH(T)) of the VCO are allowed to shift during a divide cycle via the shift register 202 and the phase multiplexer 208. It should be appreciated that other suitable means for providing a select signal for the multiplexer, such as a counter and decoder arrangement, may be employed.

Also included in the frequency multiplier 200 is a divide-by-M circuit 206 inserted in the feedback path to divide the frequency of the multiplexer output. More specifically, the divide-by-M circuit 206 receives signals output by the multiplexer 208 and provides a feedback signal having a frequency equal to the multiplexer output frequency divided by M.

According to one embodiment, division by non-integer value is achieved by advancing or retarding a defined number of clock phases during each M cycles. At the end of each M cycles, the divide-by-M circuit 206 generates an output signal which is applied to the feedback terminal (FB) of the PLL 210. This same feedback signal is used as a control signal applied to the controller state machine to restart its phase-shifting operation. When the phase-shifting operation is enabled by the control signal, the controller state machine 204 is configured to provide an enable signal to the shift register, each time a clock signal is received from the multiplexer, which causes the multiplexer to switch phases.

As noted above, in one embodiment, the frequency multiplier 200 uses output taps of a VCO ring oscillator as the source of multiple phases. There are a variety of PLL circuits that provide multiple-phase output taps. For example, PLL circuits having multiple-phase output taps may be used in components performing serial communications. In personal computer platforms, a serial communications link PLL circuit may use the multiple phase arrangement of a VCO to produce uniformly spaced multiple clock phases in over-sampling and phase interpolation applications. In one implementation, the output taps of the serial link PLL circuit are used to provide different phases to be forwarded to the feedback path.

Referring now to FIG. 3B, a phase-shifting arrangement 350 is shown for selecting different phase signals according to one embodiment of the invention. In the illustrated embodiment, the phase multiplexer embodied in the form of a number of NAND gates is coupled to receive select signals, SEL(0)-SEL(T), generated by the shift register, and phase output signals, PH(0)-PH(T), generated by the VCO ring oscillator. Based on the select signal provided by the shift register, the multiplexer will select one of the phase outputs from the ring oscillator.

By switching between different phases, the frequency multiplier 200 is able to provide non-integer multiples of a reference frequency. In one implementation, used when the selected phase is advanced, the feedback divisor (divide-by-M) is selected for a count which is larger than the desired multiplication. In another implementation, used when the selected phase is retarded, the feedback divisor (divide-by-M) is selected for a count which is smaller than the desired multiplication. And during each divide period, the phase-shifting operation switches (i.e., advances or retards) the phase signal output by the multiplexer from one phase output to another phase output, thereby shortening or lengthening the feedback period by one or more tap increments. When the period has been shortened or lengthened enough to provide the desired fraction, the multiplexer selection operation is stopped at its last selection until the end of each M cycles, when the controller state machine 204 is allowed to resume its shifting operation.

For example, in order to produce 2.5 GHz using 133 MHz as input, a non-integer 18.75 divisor is needed. Such non-integer 18.75 divisor may be accomplished by dividing the VCO output frequency by 19 in the feedback loop and using the phase multiplexer to provide a delay equal to one-quarter of the VCO output cycle every 19 cycles. This delay can be achieved by taking back one or more phases equal to one-quarter cycle.

It will be understood that there are a number of different variations of the multiplexer selection process. For example, non-integer division operation may be accomplished by advancing phases. In an alternative embodiment, the non-integer division is accomplished by retarding phase signals. Further, the phase selection process may involve switching phases by moving more than one VCO output tap. It should be noted that certain output tap selection processes, such as, for example, retarding phase signals, may need to be carefully controlled to insure that the resulting clocks from the output of the multiplexer do not glitch and cause false counts.

Figure 4:
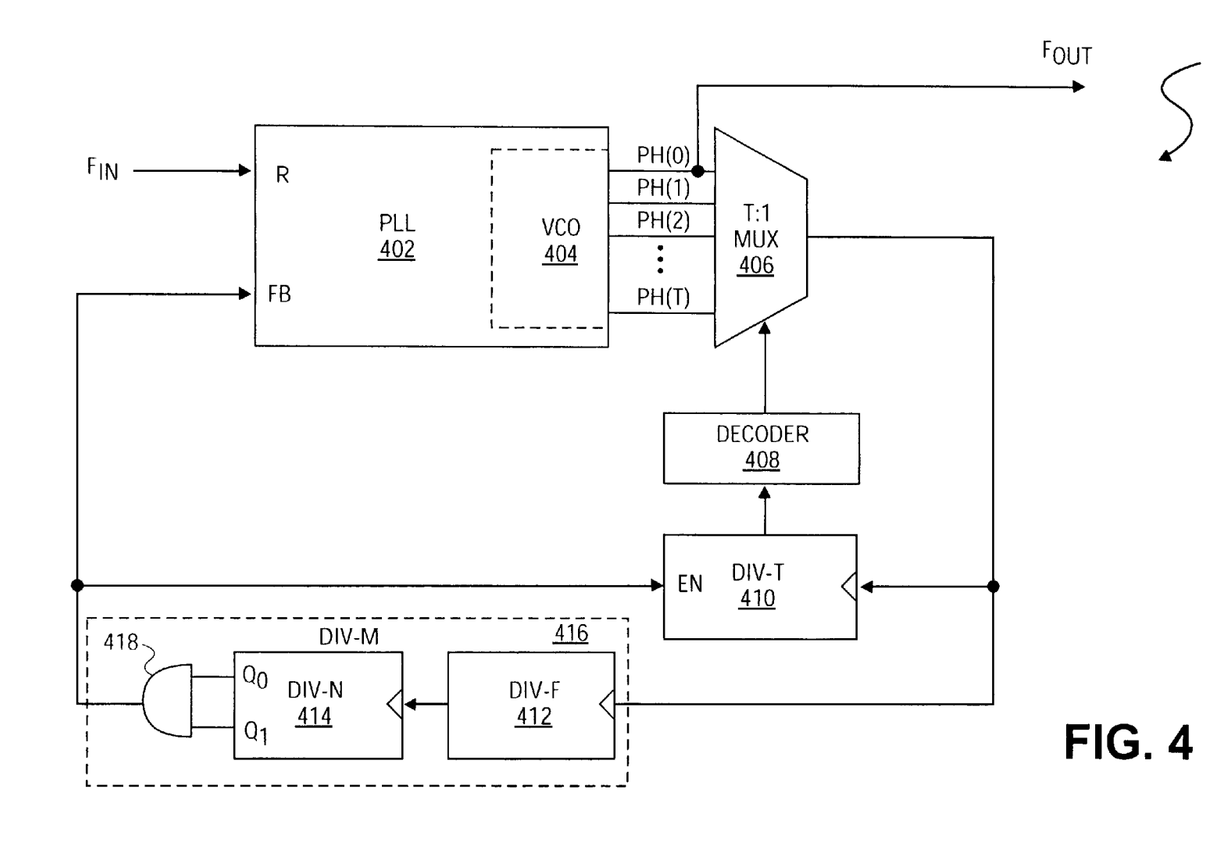
FIG. 4 shows a block diagram of a fractional frequency multiplier according to another embodiment.

FIG. 4 depicts a frequency multiplier 400 according to another embodiment of the invention. The multiplier 400 includes a phase locked loop (PLL) circuit 402 having a voltage controlled oscillator (VCO) 404 which provides multiple clock phases to a multiplexer 406. The multiplier 400 also includes one or more divisors 416 inserted in the feedback loop to divide the multiplexer frequency by M. In the illustrated embodiment, the divide-by-M 416 is decomposed into two divider circuits; namely, divide-by-N circuit 414 and divide-by-F circuit 412. The divide-by-F circuit 412 receives a clock signal output by the multiplexer 406 and provides a first output signal having a frequency substantially equal to the multiplexer output frequency divided by F. And the divide-by-N circuit 414 provides a second output signal having a frequency equal to the frequency of the first output signal divided by N.

Also included in the multiplier 400 is a counter 410 (divide-by-T) and decoder 408 arrangement to enable the multiplexer 406 to select the appropriate clock phase that is passed to the feedback loop. In one embodiment, T is selected to be an integer number equal to the number of input taps of the multiplexer 406 to enable the multiplexer to rotate through all of its input taps. The divide-by-T counter 410 has an enable terminal (EN) that receives a control signal to enable and disable its count operation. Although a counter/decoder arrangement is used to control the multiplexer in this illustrated embodiment, it should be noted that other suitable means for controlling the multiplexer may be used such as a shift register.

When the divide-by-T counter 410 is enabled through the assertion of an enable signal, this causes the divide-by-T counter 410 to increment its counter value each time it receives a clock signal from the multiplexer 406. Each time the count value is incremented, the divide-by-T counter 410 transitions the logical value of its output bits which are applied to the decoder 408. The logical values of the output bits of the divide-by-T counter 410 are decoded by the decoder 408, and based thereon, the decoder 408 generates a select signal, which enables the multiplexer 406 to select clock phases according to the logical state of the divide-by-T counter.

According to one embodiment, by properly decomposing the divide-by-M component 416 into one or more dividers or counters, an enable signal necessary for enabling the count operation of the divide-by-T counter may be obtained by forwarding the output pulse from the divide-by-M component. In one embodiment, the divider ratio F is selected to be a number equal to the number of times the clock phase needs to be switched in order to simulate a fractional division. By choosing F to equal the number of times that the clock phase has to be advanced during each M cycles, a state machine for controlling the timing of the phase shifting operation is not required. Instead, this embodiment uses the output pulse from the divide-by-N circuit to enable the divide-by-T counter.

In another embodiment, the divider ratio F is selected to be a number equal to an integer division of the number of times the clock phase needs to be switched in order to simulate a fractional division, such that K times F is the number of clock phases to be switched. In this case, K of N states of the divide-by-N circuit are us ed to enable t he divide-by-T counter.

Counters are well known to those skilled in the art. Accordingly, divide-by-T, divide-by-F and divide-by-N may be any suitable divider or counter circuit which may be programmable or non-programmable to produce one output cycle for every defined number of input cycles applied to its input.

In one implementation, the multiplier shown in FIG. 4 is used to produce a 2.5 GHz output signal using a 133 MHz as an input signal. To achieve this, a non-integer divisor of 18.75 is needed. One way of providing 18.75 divisor is by using a feedback divisor of 20 (M=20) and taking back 5 quarter cycles each M cycles by advancing five quarter-cycles every M cycles. In one implementation, divisor value N is equal to 4 and divisor value F is equal to 5. The multiple bit control signals from the divide-by-N circuit are used to control when the divide-by-T counter is enabled and disabled. As shown in FIG. 4, the output bits of the divide-by-N circuit are coupled to an AND gate. Because, in this implementation, the divide-by-N circuit is programmed to count from 1 to 4 it will transition through four logical states. And during one of those logical states, e.g., when both of its output bits are at logical high state, a logical high signal will be asserted at the enable terminal of the divide-by-T counter 410. This means that the phase-shifting operation will be enabled during one of the transitional states of the divide-by-N circuit. During such time period, the divide-by-T will receive five clock cycles from the multiplexer, causing the phases to be advanced five-quarter phases during each M cycles. By doing so, a non-integer division of 18.75 is effectively performed since the feedback divisor divides by 20 and 1.25 clock cycles are take n back each divide cycle.

According to one embodiment, the frequency multiplier shown in FIG. 4 may be programmed to output other frequencies by changing the divisor values F, N. For example, the illustrated multiplier may be used to produce a 1.5 GHz output signal using a 133 MHz as an input signal. In this case, a divisor of 11.25 is required. One way of providing 11.25 divisor is by using a feedback divisor of 12 (M=12) and taking back 3 quarter cycles each M cycles by advancing 3 quarter cycles every M cycles. This can be accomplished by setting F to equal 3 and N to equal 4.

Figure 5:
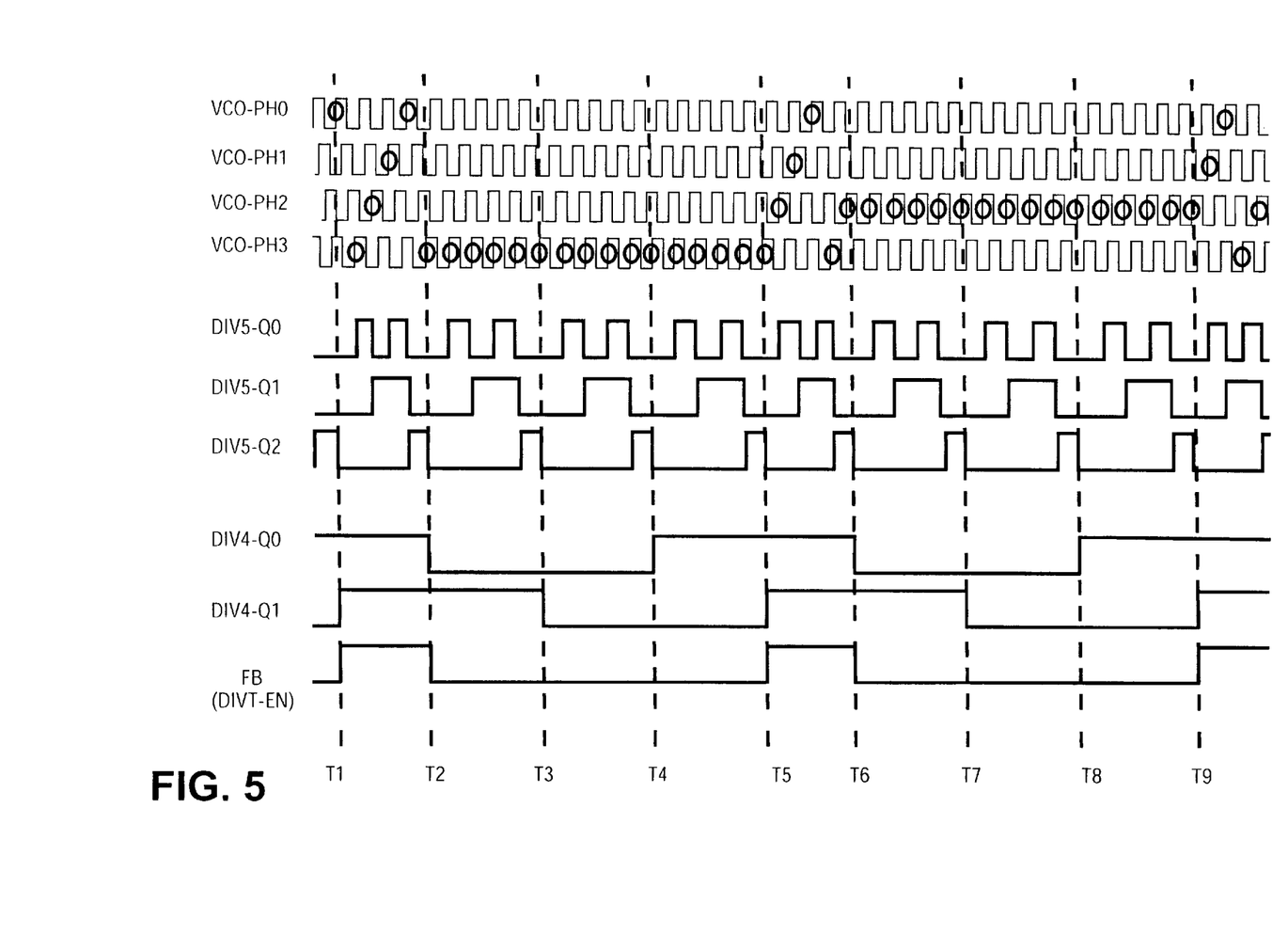
FIG. 5 shows a timing diagram of the fractional frequency multiplier of FIG. 4.

The operation of the frequency multiplier of FIG. 4 will be described in more detail with reference to the timing diagram shown in FIG. 5. The first four signal lines in FIG. 5 represent four phase signals generated by the VCO (VCO-PH0, VCO-PH1, VCO-PH2, VCO-PH3). The circles on the phase signals indicate which edges are being selected as clock signal to be passed to the feedback loop. In this case, a divide-by-5 operation is performed, by the divide-by-F circuit, on the clock signals passing through the feedback loop, producing multiple bit output signals (DIV5-D0, DIV5-Q1, DIV5-Q2). As shown, the divide-by-F counts in binary sequence by changing its bit pattern every time a clock signal is asserted. At the end of its count cycle, the divide-by-F will output an output clock pulse. In the illustrated embodiment, the divide-by-F counts from 1 to 5 and when the state of its output bits (DIV5-D0, DIV5-Q1, DIV5-Q2) transitions from (0, 0, 1) to (0, 0, 0), it will generate an output clock pulse.

The clock pulse generated by the divide-by-F circuit is received by the clock terminal of the divide-by-4 circuit. The divide-by-4 circuit has two output bits (DIV4-Q0, DIV4-Q1) which change states in response to each clock signal it receives. As seen by referring to FIG. 5, the first output clock pulse from the divide-by-F circuit (at time T1) causes the output bits of the divide-by-4 (DIV4-Q0, DIV4-Q1) to transition from (1, 0) to (1, 1). And the second output clock pulse from the divide-by-F circuit (at time T2) causes the output bits of the divide-by-4 (DIV4-Q0, DIV4-Q1) to transition from (1, 1) to (0, 1).

The output bits (DIV4-Q0, DIV4-Q1) of the divide-by-4 circuit 414 are coupled to an AND gate 418, as shown in FIG. 4. Since both inputs to the AND gate are at the logic one state between T1 and T2, i.e., both of the output bits of the divide-by-4 circuits remain high, the output of the AND gate will be at the logic one state. The output of the AND gate is forwarded as an enable signal to be applied to the divide-by-T circuit to enable its count operation while the enable signal is at logic one, between T1 and T2. During this time period when the count operation is enabled, the output bits of the divide-by-T counter is caused to transition during each VCO clock cycle, enabling the multiplexer to select different clock phase each VCO clock cycle via the decoder. And the count operation of the divide-by-T circuit will be disabled during the remaining divide cycle period, between T2 and T5, when at least one of the inputs to the AND gate will be at the logic zero state. Accordingly, the enable signal applied to the divide-by-T circuit will be at the logic zero state, disabling its count operation during such time period.

In one implementation, the divide-by-T will receive five clock cycles from the multiplexer during each of four transitional states of the divide-by-N circuits. This means that the phase-shifting operation is enabled by the enable signal output by the AND gate to advance five-quarter phase cycles during each M cycles. As a result, a non-integer division of 18.75 is effectively performed since the feedback divisor divides by 20 and 1.25 clock cycles are taken back each divide cycle.

While the foregoing embodiments of the invention have been described and shown, it is understood that variations and modifications, such as those suggested and others within the spirit and scope of the invention, may occur to those skilled in the art to which the invention pertains. The scope of the present invention accordingly is to be defined as set forth in the appended claims.

What is claimed is:

1. A system comprising:
   a phase locked loop (PLL) circuit having an oscillator to generate a plurality of phase signals;
   a phase-shifting circuit coupled to the PLL circuit to select one of the phase signals generated by said oscillator according to a defined phase sequence to be passed to a feedback loop; and
   a divide-by-M circuit inserted in said feedback loop which divides a frequency of a feedback signal by an integer value M, wherein said divide-by-M circuit provides a control signal to enable phase-shifting operation of said phase-shifting circuit, wherein an output of said divide-by-M circuit is coupled to a feedback input of the PLL circuit.

2. The system of claim 1, wherein said feedback signal generated by said divide-by-M circuit serves as the control signal to enable phase-shifting operation of the phase-shifting circuit.

3. The system of claim 1, wherein division by a non-integer value is accomplished by switching phase signals a defined number of times during each M cycles.

4. The system of claim 1, wherein said phase-shifting circuit comprises a multiplexer coupled to select one of said plurality of phase signals generated by said oscillator according to a select signal received, and a controller coupled to a multiplexer to control the selection of different phases according to a defined phase sequence each M cycles.

5. The system of claim 4, wherein said controller includes a shift register coupled to said multiplexer to control the selection of different phases according to a control signal received from a state machine.

6. The system of claim 4, wherein said controller includes a counter and decoder arrangement to control the multiplexer to select different phases when an enable signal is asserted.

7. The system of claim 1, wherein said divide-by-M circuit comprises a divide-by-N circuit and a divide-by-F circuit, wherein the divisor value of F is selected to be equal to the number of times the clock phase has to be changed during each M cycles.

8. The system of claim 7, wherein the number of times the clock phase is to be changed is enabled during one of the transitional states of said divide-by-N circuit.

9. The system of claim 1, wherein said divide-by-M circuit comprises a divide-by-N circuit and a divide-by-F circuit, wherein the divisor value of F is selected to be an integer divisor of the number of times the clock phase has to be changed during each M cycles.

10. The system of claim 9, wherein the number of times the clock phase is to be changed is enabled during at least two of the transitional states of said divide-by-N circuit.

11. A method comprising:
    using a phase locked loop (PLL) circuit to generate a plurality of phase signals based on an input reference signal and a feedback signal;
    selecting one of the phase signals to be forwarded as a selected signal;
    dividing a frequency of the selected signal by an integer value M;
    using the divided signal as a control signal to enable the selecting of a different phase; and
    using the divided signal as the feedback signal to be applied to the PLL circuit.

12. The method of claim 11, wherein division by a non-integer value is accomplished by switching phase signals a defined number of times during each M cycles.

13. The method of claim 11, further comprising controlling the selection of different phases according to a defined phase sequence each M cycles.

14. The method of claim 11, wherein the dividing of the selected signal by M is accomplished by a combination of divide-by-N and divide-by-F circuits, wherein the divisor value of F is selected to be equal to the number of times the clock phase has to be changed during each M cycles.

15. The method of claim 14, wherein a different phase signal is selected during one of the transitional states of said divide-by-N circuit.

16. The method of claim 11, wherein the dividing of the selected signal by M is accomplished by a combination of divide-by-N and divide-by-F circuits, wherein the divisor value of F is selected to be an integer divisor of the number of times the clock phase has to be changed during each M cycles.

17. The method of claim 16, wherein a different phase signal is selected during at least two of the transitional states of said divide-by-N circuit.

18. A frequency multiplier comprising:
    a phase locked loop (PLL) circuit having a reference frequency input and a feedback input, said PLL circuit having an oscillator to generate a plurality of phase signals;
    a phase-shifting circuit coupled to the PLL circuit to select one of the phase signals generated by said oscillator according to a defined phase sequence to be passed to a feedback loop; and
    a divide-by-M arrangement inserted in said feedback loop to divide the signals selected by said phase shifting circuit, wherein said divide-by-M circuit comprises a divide-by-N circuit coupled in series with a divide-by-F circuit, wherein an output of the divide-by-M arrangement is coupled to said feedback input of the PLL circuit, wherein the divide-by-M arrangement provides a control signal to enable phase-shifting operation of said phase-shifting circuit.

19. The frequency multiplier of claim 18, wherein the divisor value of F is selected to be equal to the number of times the clock phase has to be changed during each M cycles.

20. The frequency multiplier of claim 19, wherein said phase-shifting circuit is enabled during one of the transitional states of said divide-by-N circuit.

21. The frequency multiplier of claim 18, wherein the divisor value of F is selected to be equal to an integer divisor of the number of times the clock phase has to be changed during each M cycles.

22. The frequency multiplier of claim 21, wherein said phase-shifting circuit is enabled during at least two of the transitional states of said divide-by-N circuit.

23. The frequency multiplier of claim 18, wherein a feedback signal generated by said divide-by-M arrangement serves as the control signal to enable phase-shifting operation of the phase-shifting circuit.

24. The frequency multiplier of claim 18, wherein division by a non-integer value is accomplished by switching phase signals a defined number of times during each M cycles.

25. The frequency multiplier of claim 18, wherein said phase-shifting circuit comprises a multiplexer coupled to select one of said plurality of phase signals generated by said oscillator according to a select signal received, and a controller coupled to a multiplexer to control the selection of different phases according to a defined phase sequence each M cycles.

26. The frequency multiplier of claim 25, wherein said controller includes a counter and decoder arrangement to control the multiplexer to select different phases when an enable signal is asserted.

27. The frequency multiplier of claim 25, wherein said controller includes a shift register to control the multiplexer to select different phases when an enable signal is asserted.

28. The frequency multiplier of claim 18, wherein said counter is enabled during one of the transitional states of said divide-by-N circuit.

29. The frequency multiplier of claim 18, wherein said oscillator comprises a series of buffers formed into a ring configuration.

* * * * *